(12) United States Patent
Yamaoka (10) Patent No.: US 10,847,405 B2
(45) Date of Patent: Nov. 24, 2020

(54) METHOD FOR MANUFACTURING SEMICONDUCTOR DEVICE

(71) Applicant: NICHIA CORPORATION, Anan (JP)

(72) Inventor: Kensuke Yamaoka, Anan (JP)

(73) Assignee: NICHIA CORPORATION, Anan (JP)

(*) Notice: Subject to any disclaimer, the term of this patent is extended or adjusted under 35 U.S.C. 154(b) by 307 days.

(21) Appl. No.: 16/117,214

(22) Filed: Aug. 30, 2018

(65) Prior Publication Data

US 2019/0067074 A1 Feb. 28, 2019

(30) Foreign Application Priority Data

Aug. 31, 2017 (JP) .................... 2017-166384

(51) Int. Cl.
*H01L 21/683* (2006.01)
*H01L 21/52* (2006.01)
(Continued)

(52) U.S. Cl.
CPC .......... *H01L 21/6838* (2013.01); *H01L 21/52* (2013.01); *H01L 21/67132* (2013.01); *H01L 21/67144* (2013.01); *H01L 21/67721* (2013.01); *H01L 21/68* (2013.01); *H01L 24/32* (2013.01); *H01L 24/49* (2013.01);
(Continued)

(58) Field of Classification Search
CPC ............... H01L 21/52; H01L 21/67132; H01L 21/67144; H01L 21/67721; H01L 24/32; H01L 24/49; H01L 33/0095; H01L 2224/32245; H01L 2224/48091; H01L 2224/48465; H01L 2224/49107; H01L 2224/73265
See application file for complete search history.

(56) References Cited

U.S. PATENT DOCUMENTS 7,629,231 B2 * 12/2009 Maki ................. H01L 21/67092
228/180.22
8,318,548 B2 * 11/2012 Yamashita ............. H01L 24/32
438/123
(Continued)

FOREIGN PATENT DOCUMENTS

CN 105428273 A * 3/2016
JP 5-208390 A 8/1993
(Continued)

*Primary Examiner* — Carl J Arbes
(74) *Attorney, Agent, or Firm* — Birch, Stewart, Kolasch & Birch, LLP (57) ABSTRACT

A semiconductor device manufacturing method includes: (A) orienting an upper surface of a semiconductor element which has the upper surface and a suction surface of a collet which has a suction hole so that the upper surface of the semiconductor device and the suction surface of the collet face each other, the upper surface including a first region and a second region, the second region lying higher than the first region; (B) bringing the suction surface of the collet into contact with a part of the second region of the semiconductor element; and (C) picking up the semiconductor element using the collet while the collet sucks in air between the first region and the suction surface via the suction hole, wherein in (B), an entirety of an uppermost surface of the second region is in contact with a region of the suction surface exclusive of the suction hole.

8 Claims, 9 Drawing Sheets

(51) Int. Cl.
*H01L 21/68* (2006.01)
*H01L 21/67* (2006.01)
*H01L 21/677* (2006.01)
*H01L 33/00* (2010.01)
*H01L 23/00* (2006.01)

(52) U.S. Cl.
CPC ............ *H01L 33/0095* (2013.01); *H01L 2224/32245* (2013.01); *H01L 2224/48091* (2013.01); *H01L 2224/48465* (2013.01); *H01L 2224/49107* (2013.01); *H01L 2224/73265* (2013.01); *H01L 2224/97* (2013.01)

(56) References Cited

U.S. PATENT DOCUMENTS

| | | | |
|---|---|---|---|
| 8,796,076 B2 * | 8/2014 | Yoshimura | H01L 24/75 438/118 |
| 2007/0196952 A1 * | 8/2007 | Yoshimura | H01L 23/3128 438/108 |

FOREIGN PATENT DOCUMENTS

| | | | |
|---|---|---|---|
| JP | 11-97742 A | | 4/1999 |
| JP | 2000-323504 A | | 11/2000 |
| JP | 2003-229637 A | | 8/2003 |
| JP | 2003-297862 A | | 10/2003 |
| JP | 2004-58199 A | | 2/2004 |
| JP | 2005-103659 A | | 4/2005 |
| JP | 4497304 B | * | 6/2006 |
| JP | 2013-102128 A | | 5/2013 |
| WO | WO 2015/140849 A1 | | 9/2015 |

* cited by examiner

METHOD FOR MANUFACTURING SEMICONDUCTOR DEVICE

CROSS-REFERENCE TO RELATED APPLICATION

This application claims priority to Japanese Patent Application No. 2017-166384, filed on Aug. 31, 2017, the disclosure of which is hereby incorporated by reference in its entirety.

BACKGROUND

The present disclosure relates to a method for manufacturing a semiconductor device.

In transferring and placing a semiconductor chip in the die bonding process or the like, the method of picking up the semiconductor chip with a tip end of a collet which has a suction hole being brought into contact with the upper surface of the semiconductor chip is usually employed (see, for example, Japanese Patent Publication No. 2000-323504).

SUMMARY

In the field of semiconductor devices, there is a demand for yield improvement. Suppressing occurrence of defective products which is attributed to transfer and placement of semiconductor chips, semiconductor elements, etc., which accompanies the processes of die bonding, packaging, etc., is advantageous.

A semiconductor device manufacturing method of the present disclosure includes: (A) orienting an upper surface of a semiconductor element which has the upper surface and a lower surface and a suction surface of a collet which has a suction hole so that the upper surface of the semiconductor device and the suction surface of the collet face each other, the upper surface including a first region and a second region, the second region lying higher than the first region, the first region including a first electrode, the second region including a second electrode; (B) bringing the suction surface of the collet into contact with a part of the second region of the semiconductor element; and (C) picking up the semiconductor element using the collet while the collet sucks in air between the first region of the semiconductor element and the suction surface of the collet via the suction hole, wherein in (B), an entirety of an uppermost surface of the second region is in contact with a region of the suction surface exclusive of the suction hole.

According to an embodiment of the present disclosure, occurrence of defective products which is attributed to transfer and placement of semiconductor elements, etc., can be suppressed. For example, occurrence of scars in the uppermost surface of a semiconductor element can be precluded.

BRIEF DESCRIPTION OF THE DRAWINGS

FIG. 7 is a see-through top view showing that the suction surface 120a of the collet 100A is in contact with the uppermost surface MF of the second region R2 of the semiconductor element 200A. FIG. 7 shows another example of the arrangement of the uppermost surface MF of the second region R2 and a suction hole 130s.

DETAILED DESCRIPTION

Hereinafter, embodiments of the present disclosure will be described in detail with reference to the drawings. The embodiments which will be described below are merely exemplary. A semiconductor device manufacturing method of the present disclosure is not limited to the embodiments which will be described below. For example, values, shapes, materials, steps and the order of steps which will be specified in the embodiments described below are merely exemplary, and various modifications thereto are possible so long as no technical inconsistency occurs.

The dimensions and sizes of components shown in the drawings are sometimes exaggerated for clear understanding. The dimensions, shapes, and relative sizes of components in an actual semiconductor device and manufacturing device are sometimes not reflected in the drawings. To avoid excessively complicated drawings, some components are sometimes not shown in the drawings.

In the following description, components which have substantially the same function are designated by a common reference numeral, and the description thereof is sometimes omitted. In the following description, the terms which designate specific directions or positions (e.g., "upper", "lower", "right", "left", and other terms including such terms) are sometimes used. Such terms are used merely for clear understanding of relative directions or positions in the referred drawings. So long as the relationship of relative directions or positions designated by terms such as "upper", "lower", etc., in the referred drawings is identical, drawings other than those provided in the present disclosure or actual products and manufacturing devices may not have identical arrangements to those shown in the referred drawings. In the present disclosure, "parallel" includes the cases where two lines, sides or planes are in the range of about ±5° from 0° unless otherwise specified. In the present disclosure, "vertical" or "perpendicular" includes the cases where two lines, sides or planes are in the range of about ±5° from 90° unless otherwise specified.

[Outline of Semiconductor Device Manufacturing Method]

Figure 1:
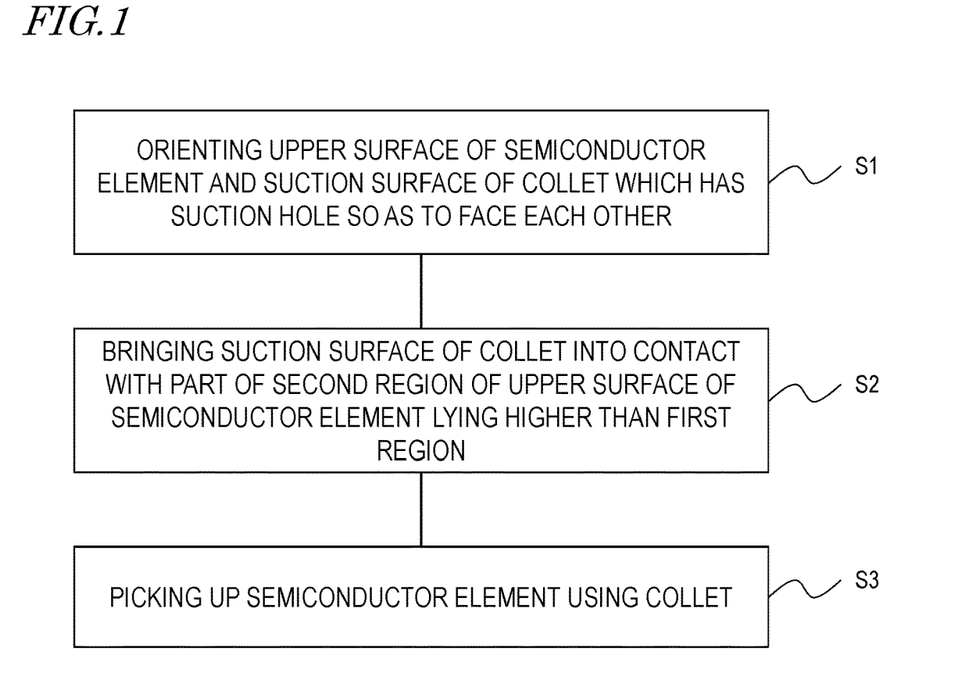
FIG. 1 is a flowchart showing the outline of a semiconductor device manufacturing method of an embodiment of the present disclosure.

FIG. 1 is a flowchart showing the outline of a semiconductor device manufacturing method of an embodiment of the present disclosure. The semiconductor device manufacturing method illustrated in FIG. 1 includes orienting the upper surface of a semiconductor element and a suction surface of a collet which has a suction hole so that the upper surface of the semiconductor device and the suction surface of the collet face each other (step S1), bringing the suction surface of the collet into contact with a part of the second region of the upper surface of the semiconductor element lying higher than the first region (step S2), and picking up the semiconductor element using the collet (step S3). As will be described later in detail, in the embodiment of the present disclosure, step S2 is carried out such that the entirety of the uppermost surface in the second region is in contact with a region of the suction surface exclusive of the suction hole.

According to an embodiment of the present disclosure, in picking up a semiconductor element, the suction surface of the collet is brought into contact with the semiconductor element such that the uppermost surface of the second region lying higher than the first region is in contact with a region of the suction surface of the collet exclusive of the suction hole. Thus, the periphery of the suction hole is precluded from being present immediately above the uppermost surface of the second region, and hence, local application of force onto the uppermost surface of the second region is prevented. Therefore, occurrence of scars or the like in the upper surface of the semiconductor element due to contact of the collet can be suppressed, and it is advantageous for yield improvement. Particularly when the uppermost surface of the second region includes a surface of an electrode, occurrence of scars or the like in the electrode surface due to contact of the collet can be precluded. The preclusion of occurrence of scars or the like in the electrode surface can contribute not only to yield improvement but also to improvement in reliability of a finally-obtained semiconductor device.

Prior to describing an embodiment of the semiconductor device manufacturing method, a typical example of a device configuration of a semiconductor element which is to be transferred and placed using a collet and an exemplary configuration of the collet are first described.

[Semiconductor Element 200]

Figure 2:
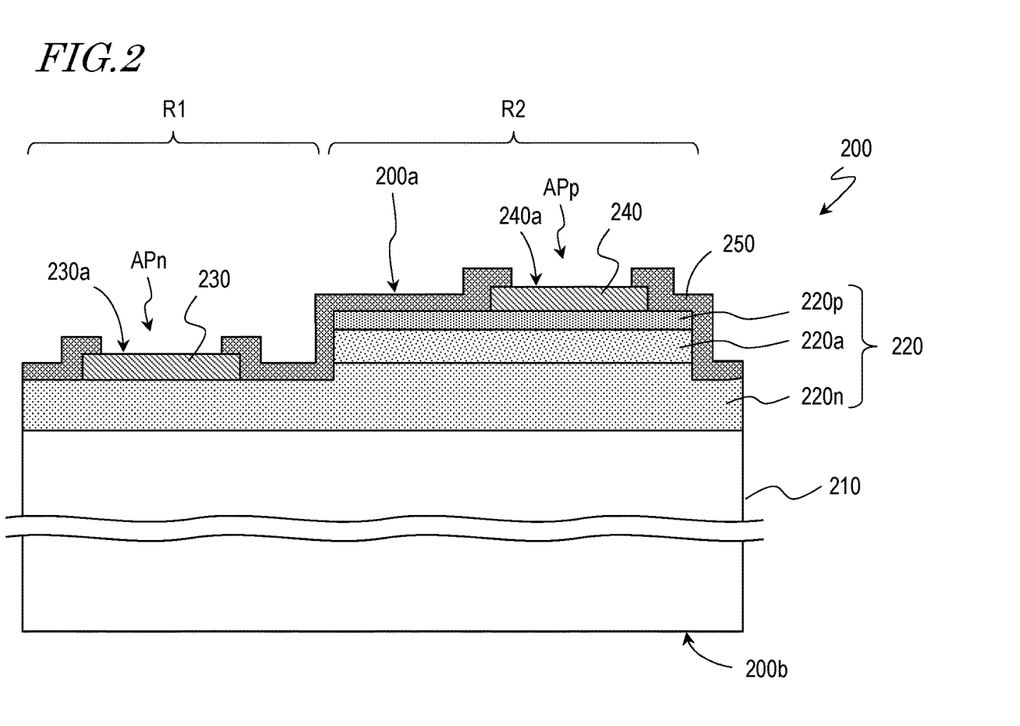
FIG. 2 is a schematic cross-sectional view of an example of a semiconductor element which is to be transferred and placed using a collet.

FIG. 2 schematically shows a cross section of an example of a semiconductor element. The semiconductor element 200 shown in FIG. 2 includes a supporting substrate 210, a multilayer structure 220 including one or more semiconductor layers on the supporting substrate 210, a first electrode 230, and a second electrode 240. In this example, the semiconductor element 200 further includes an insulative protecting layer 250 which covers the multilayer structure 220. The protecting layer 250 is a film of phosphate glass (PSG), silicon nitride, silicon oxide, or the like, which has a thickness of, for example, not less than about 0.15 µm and not more than about 0.25 µm. As illustrated, the protecting layer 250 has an opening APn and an opening APp at a position overlapping the first electrode 230 and a position overlapping the second electrode 240, respectively. Therefore, the upper surface 230a of the first electrode 230 is exposed from the protecting layer 250 at the position of the opening APn, and the upper surface 240a of the second electrode 240 is exposed from the protecting layer 250 at the position of the opening APp.

In the configuration illustrated in FIG. 2, the multilayer structure 220 includes an n-type semiconductor layer 220n and a p-type semiconductor layer 220p. The n-type semiconductor layer 220n is the first semiconductor layer of the first conductivity type on the supporting substrate 210. The p-type semiconductor layer 220p is the second semiconductor layer of the second conductivity type provided above a part of the n-type semiconductor layer 220n. In this example, an active layer 220a is provided between the n-type semiconductor layer 220n and the p-type semiconductor layer 220p. Here, "provided above a part of the n-type semiconductor layer 220n" is not limited to a configuration where the p-type semiconductor layer 220p is in direct contact with the n-type semiconductor layer 220n but can be interpreted to include a wide variety of configurations where another functional layer, such as the active layer 220a, intervenes as schematically shown in FIG. 2.

The first electrode 230 and the second electrode 240, which have been described above, are provided on the n-type semiconductor layer 220n and the p-type semiconductor layer 220p, respectively. In other words, the first electrode 230 is present on a portion of the n-type semiconductor layer 220n exclusive of a portion above which the p-type semiconductor layer 220p is provided, and the second electrode 240 is present on the p-type semiconductor layer 220p. The first electrode 230 and the second electrode 240 are, for example, a single layer film or a multilayer film of a metal, such as Ag, Al, Au, Cu, Ti, Ni, Pt, Pd, or W. The contours of the first electrode 230 and the second electrode 240 as viewed from the top are, for example, circular.

The semiconductor element 200 has a lower surface 200b and an upper surface 200a which is opposite to the lower surface 200b. The lower surface 200b of the semiconductor element 200 is identical with one of the major surfaces of the supporting substrate 210 which is opposite to the multilayer structure 220 side. The entirety of the lower surface 200b is generally flat. Meanwhile, the upper surface 200a of the semiconductor element 200 can have a step. In the configuration illustrated in FIG. 2, the upper surface 200a includes a first region R1 and a second region R2 lying higher than the first region R1. Herein, the phrase "lying higher than" means being located more distant from the lower surface 200b of the semiconductor element but does not intend to limit the attitude of the semiconductor element 200.

The second region R2 generally corresponds to a region of the upper surface 200a in which the p-type semiconductor layer 220p is present when viewed from the top. The first region R1 generally corresponds to a region of the upper surface 200a in which the p-type semiconductor layer 220p is not provided. In this example, the multilayer structure 220 is covered with the protecting layer 250, and therefore, when viewed from the top, the second region R2 can have an area slightly greater than the upper surface of the p-type semiconductor layer 220p. As previously described, the second electrode 240 is present on the p-type semiconductor layer 220p, and the first electrode 230 is present on a portion of the n-type semiconductor layer 220n exclusive of a portion in which the p-type semiconductor layer 220p is provided. Thus, it can be said that the second region R2 and the first region R1 are a region including the second electrode 240 and a region including the first electrode 230, respectively.

The semiconductor element 200 can be a semiconductor light-emitting element, such as LED (Light Emitting Diode). In the following description, a semiconductor light-emitting element is illustrated as the semiconductor element 200. In this case, the multilayer structure 220 can emit light when a predetermined current is supplied to the first electrode 230 and the second electrode 240. As the multilayer structure 220, a structure which emits light of any arbitrary wavelength may be selected. When the multilayer structure 220 includes a nitride semiconductor ($In_xAl_yGa_{1-x-y}N$, 0≤x, 0≤y, x+y≤1), the multilayer structure 220 can be a light-emitting structure which is capable of emitting light in the range of ultraviolet to visible light. The multilayer structure 220 may be a light-emitting structure which is capable of emitting, for example, blue or green light. Alternatively, red light can also be obtained by forming a multilayer structure 220 which includes a semiconductor such as GaAlAs, AlInGaP, GaAsP, GaP, or the like.

Light from the multilayer structure 220 is extracted, for example, from the side opposite to the supporting substrate 210 side, i.e., from the upper surface 200a side of the semiconductor element 200. The light emitted by the multilayer structure 220 may also be extracted from the lateral surfaces of the multilayer structure 220 and the lateral surfaces of the supporting substrate 210. Alternatively, when the supporting substrate 210 faces upward, the light from the multilayer structure 220 may be extracted from the supporting substrate 210 side of the multilayer structure 220. When the light is extracted from the lateral surfaces of the supporting substrate 210 or when the supporting substrate 210 faces upward and the light is extracted via the supporting substrate 210, the supporting substrate 210 can be a light-transmitting substrate, such as a sapphire substrate. Herein, the term "light-transmitting" used in this specification is not limited to "transparent" but should be broadly interpreted to include exhibiting diffusiveness for incoming light. In either case, the supporting substrate 210 used only need to be a substrate on which one or more semiconductor layers can be grown as constituents of the multilayer structure 220. Note that the semiconductor element 200 can have a reflective film, such as a dielectric reflective film, over a surface opposite to the side from which light is to be extracted.

[Collet 100A]

Figure 3:
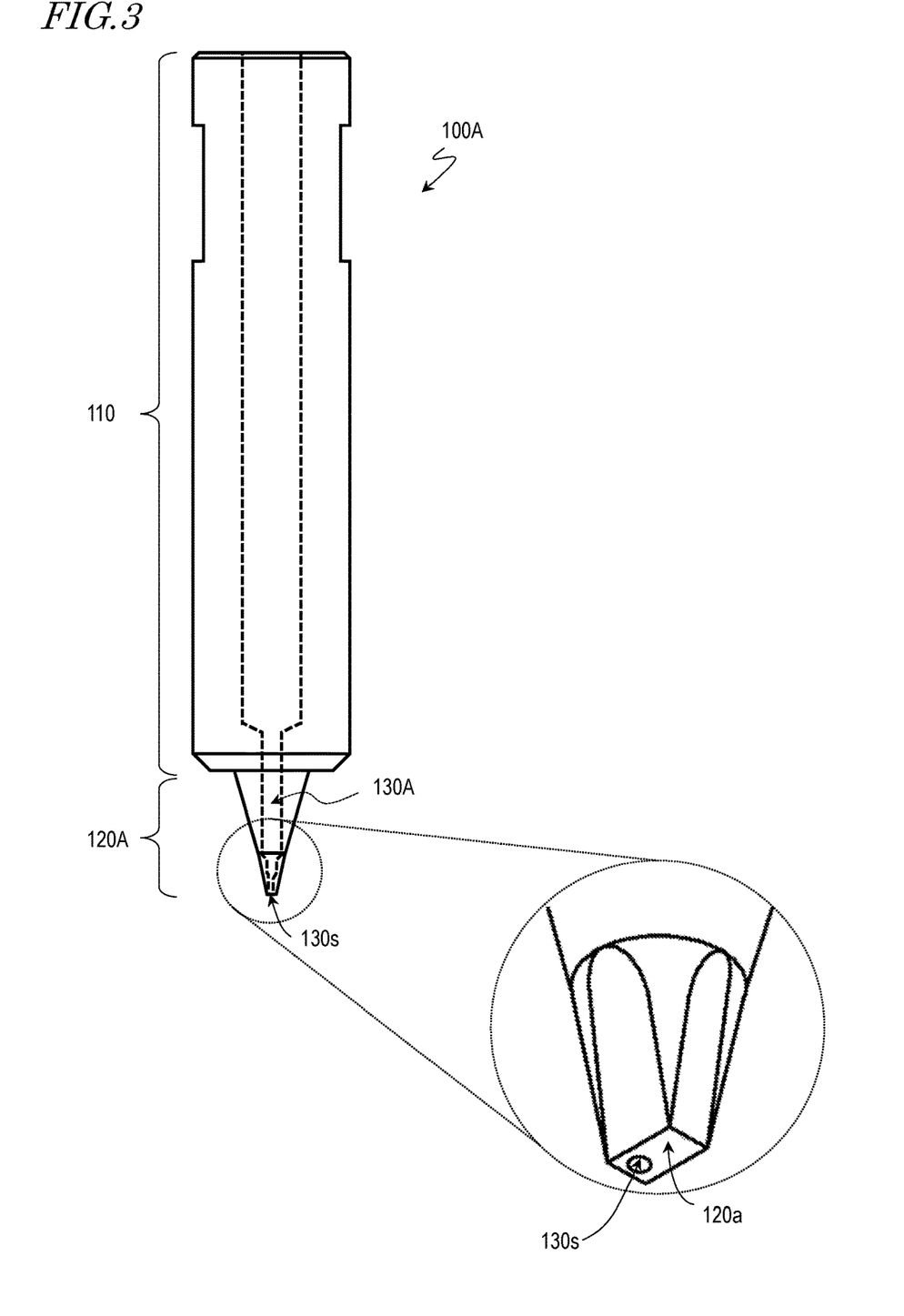
FIG. 3 shows an example of a collet adapted for picking up of a semiconductor element 200, together with the tip end portion of the collet.

FIG. 3 shows an example of a collet adapted for picking up of the semiconductor element 200. The collet 100A illustrated in FIG. 3 includes a main part 110 and a tip end portion 120A which is provided at one end of the main part 110 and which has a tapered shape. The collet 100A is made of cemented carbide, ceramic, hard resin, or the like. When the collet 100A is used, the collet 100A is attached to a mount which has a chuck for receiving the other end of the collet 100A. The mount is configured such that different types of collets can be replaceably mounted according to the object to be picked up. Herein, the mount is attached to a die bonder for supporting the collet 100A.

In FIG. 3, the whole exterior of the collet 100A and an enlarged view of the tip end portion 120A are shown together in one drawing. As shown in the lower right part of FIG. 3, the collet 100A has a suction surface 120a at an end of the tip end portion 120A which is opposite to the main part 110. In this example, the suction surface 120a is a flat surface. Note that, however, it is not requisite that the entirety of the suction surface 120a is flat.

The suction surface 120a has a suction hole 130s. In this example, the suction hole 130s is a circular opening. As a matter of course, the shape of the suction hole 130s is not limited to circular but may be arbitrary.

The inside of the collet 100A has a through-hole 130A. One end of the through-hole 130A reaches the suction hole 130s. When the collet 100A is mounted to the mount, the through-hole 130A is in communication with a vacuum line provided inside the mount and forms a channel for suction of air.

[Embodiment of Semiconductor Device Manufacturing Method]

Hereinafter, a semiconductor device manufacturing method with the use of the collet 100A is described in more detail. Herein, manufacture of a semiconductor device which includes, as its constituent, the semiconductor element 200 in the form of a semiconductor light-emitting element, in other words, manufacture of a light-emitting device, is described as an example. In the process of manufacturing a light-emitting device which includes a semiconductor light-emitting element, transfer and placement of the semiconductor element 200 with the use of the collet 100A can be performed in selection and mounting of the semiconductor element 200. In the following paragraphs, an example of application to die bonding to a composite substrate integrally formed by an electrically-conductive leadframe and a resin part is described.

Figure 4:
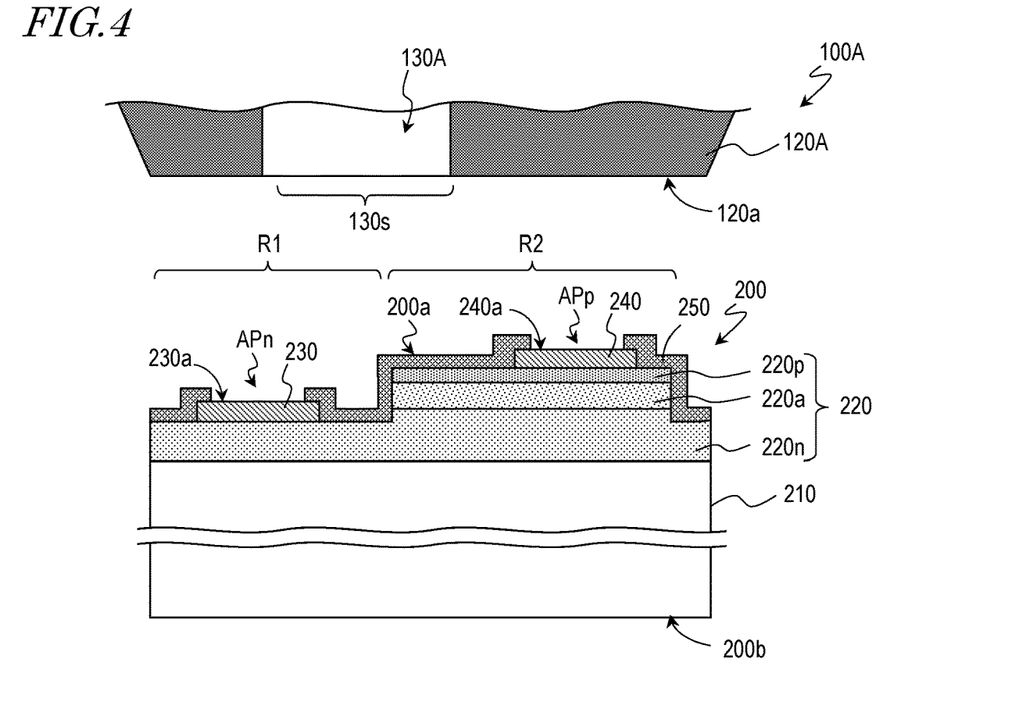
FIG. 4 is a schematic cross-sectional view for illustration of an exemplary semiconductor device manufacturing method of an embodiment of the present disclosure.

First, as shown in FIG. 4, the upper surface 200a of the semiconductor element 200 at the first position and the suction surface 120a of the collet 100A attached to the die bonder are oriented so as to face each other (step S1 of FIG. 1). In this step, alignment can be performed by, for example, image recognition with the use of a camera of the die bonder. The first position is, herein, a predetermined position inside the die bonder. Inside the die bonder, the semiconductor element 200 can be supported by a dicing tape, a carrier tape which has a recess for holding the semiconductor element 200, or the like.

Figure 5:
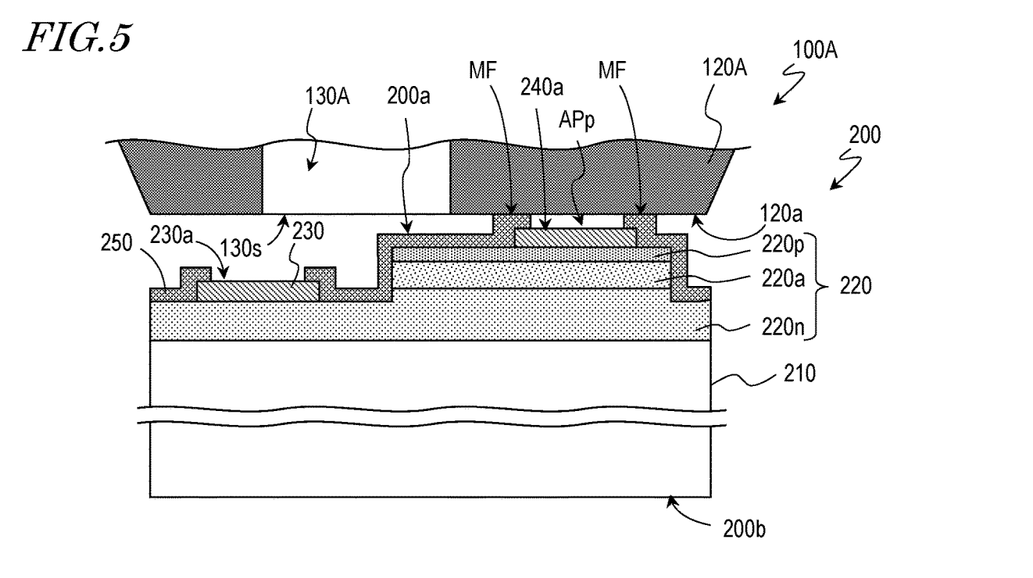
FIG. 5 is a schematic cross-sectional view showing that the suction surface 120a of the collet 100A is in contact with the uppermost surface MF of the second region R2 of the semiconductor element 200.

Then, as shown in FIG. 5, the suction surface 120a of the collet 100A is brought into contact with a part of the second region R2 of the semiconductor element 200 (step S2 of FIG. 1). In the embodiment of the present disclosure, in this step, the uppermost surface MF of the second region R2 is in contact with a region of the suction surface 120a exclusive of the suction hole 130s.

In this example, a part of the protecting layer 250 is present on the upper surface 240a of the second electrode 240. Therefore, a region of the surface of the protecting layer 250 surrounding the second electrode 240, for example, an annular region, forms the uppermost surface MF. In FIG. 5, the uppermost surface MF is depicted as being a flat surface. However, the uppermost surface MF is not limited to a flat surface which has a predetermined area or larger. For example, the uppermost surface MF can be a thin, elongated region which can be regarded as a line, a point, or an aggregate of such regions. When the second region R2 includes a curved surface and/or a step, a portion of the second region R2 which is most distant from the lower surface 200b of the semiconductor element forms the uppermost surface MF. When the protecting layer 250 is not present on the upper surface 240a of the second electrode 240 and the second electrode 240 has a greater thickness than the protecting layer 250 or when the semiconductor element does not include the protecting layer 250, the upper surface 240a of the second electrode 240 forms the uppermost surface MF.

According to research conducted by the present inventor, when a hard collet which has a suction hole in the suction surface, such as the collet 100A, is brought into contact with the upper surface of a semiconductor element and the periphery of the suction hole is at a position overlapping the highest portion of the upper surface of the semiconductor element, the force concentrates at the highest portion of the upper surface of the semiconductor element, and there is a probability that damage, such as a scar, will occur in that highest portion. Occurrence of damage to the upper surface of the semiconductor element due to pressing of the collet leads to decrease of the yield of the light-emitting device.

In view of the above-described circumstances, according to the embodiment of the present disclosure, the uppermost surface MF of the second region R2 of the upper surface 200a of the semiconductor element 200, which is lying higher than the first region R1, is brought into contact with a region of the suction surface 120a exclusive of the suction hole 130s. By bringing the uppermost surface MF of the second region R2 into contact with a region of the suction surface 120a exclusive of the suction hole 130s, the pressure exerted by the collet can be prevented from concentrating at a part of the uppermost surface MF. That is, occurrence of damage to the upper surface 200a of the semiconductor element 200 due to contact of the collet can be precluded. Particularly in the example shown in FIG. 5, the suction surface 120a is brought into contact with the uppermost surface MF such that the entirety of the uppermost surface MF of the second region R2 is in contact with a region of the suction surface 120a exclusive of the suction hole 130s, so that occurrence of damage to the upper surface 200a of the semiconductor element 200 due to contact of the collet can be precluded more effectively.

Figure 6:
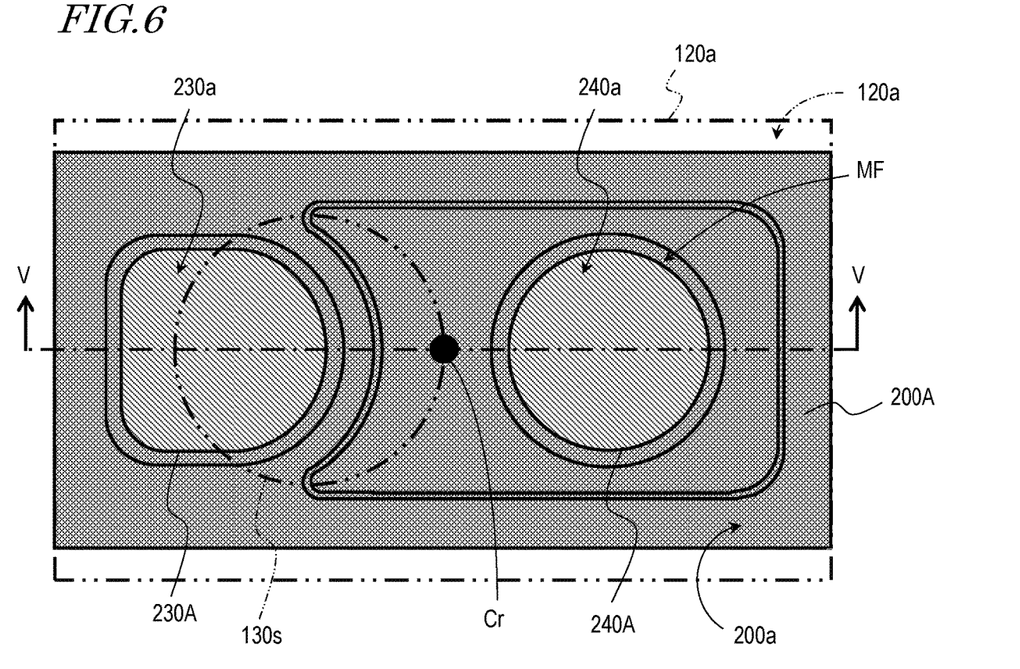
FIG. 6 is a see-through top view showing that the suction surface 120a of the collet 100A is in contact with the uppermost surface MF of the second region R2 of a semiconductor element 200A.

FIG. 6 is a see-through top view showing that the suction surface 120a of the collet 100A is in contact with the uppermost surface MF of the second region R2 of a semiconductor element 200A. Herein, the semiconductor element 200A is an example of the above-described semiconductor element 200. The cross section shown in FIG. 5 is identical with a cross section taken along line V-V of FIG. 6. In the configuration illustrated in FIG. 6, the contour of the semiconductor element 200A as viewed from the top is rectangular, and the suction surface 120a also has a rectangular contour corresponding to the contour of the semiconductor element 200A. Note that, however, in the embodiment of the present disclosure, it is not necessary that, when viewed in plan, the shape of the suction surface 120a is identical with the contour of the semiconductor element 200. Also, it is not necessary that, when viewed in plan, the shape of the suction surface 120a is similar to the contour of the semiconductor element 200.

In this example, a part of the suction hole 130s faces the first region R1 while the remaining part of the suction hole 130s is at a position overlapping a portion of the second region R2 exclusive of a portion in which the second electrode 240A is provided (see also FIG. 4 and FIG. 5). By thus locating the suction hole 130s at a position in the suction surface 120a not overlapping the second electrode 240A, the periphery of the suction hole 130s can be precluded from coming into contact with the second electrode 240A. Therefore, for example, even when the uppermost surface MF of the second region R2 includes the upper surface 240a of the second electrode 240A, occurrence of a scar in the second electrode 240A due to contact of the collet 100A can be suppressed. Thus, the reliability of a finally-obtained light-emitting device can be improved.

In the example shown in FIG. 6, a part of the suction hole 130s overlaps the first electrode 230A. However, as seen from FIG. 4 and FIG. 5, herein, the first electrode 230A is in the first region R1, and the upper surface 230a of the first electrode 230A is at a position lower than the uppermost surface MF of the second region R2. Therefore, the periphery of the suction hole 130s would not come into contact with the upper surface 230a of the first electrode 230A.

Figure 7:
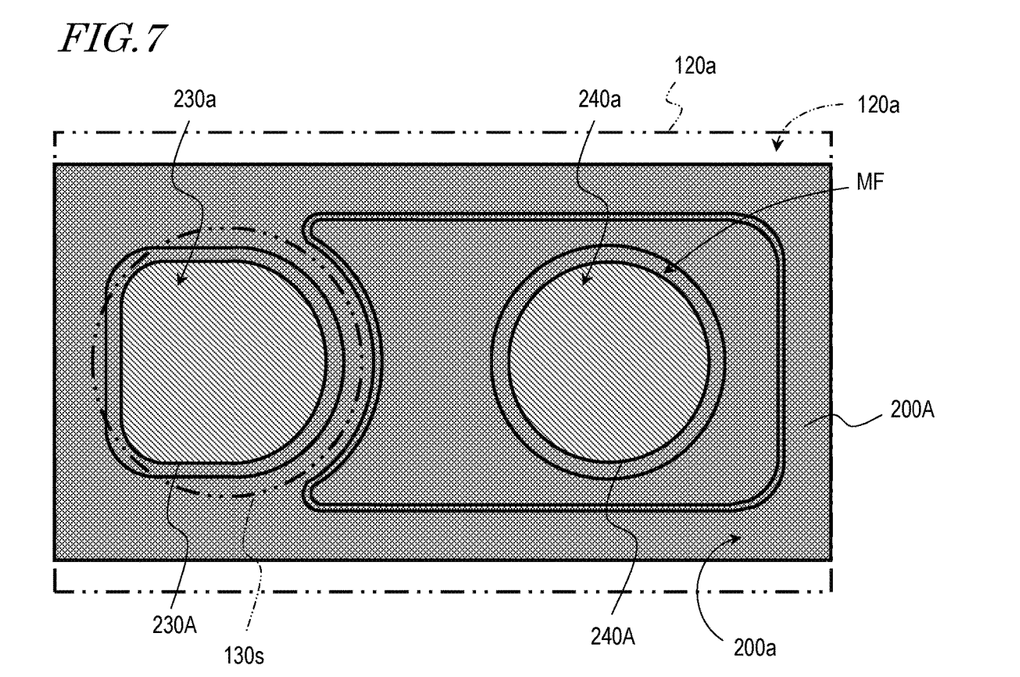

Alternatively, as illustrated in FIG. 7, the entirety of the suction hole 130s may face the first region R1 (see also FIG. 4 and FIG. 5). Such a configuration can also likewise achieve the effect of suppressing occurrence of damage to the upper surface 200a of the semiconductor element 200A. Particularly, so long as the entirety of the suction hole 130s faces the first region R1, the suction hole 130s would not overlap the second electrode 240A. Therefore, occurrence of a scar in the second electrode 240 due to contact of the collet 100A can be prevented more assuredly.

Then, the semiconductor element 200 is picked up using the collet 100A while the air between the first region R1 of the semiconductor element 200 and the suction surface 120a of the collet 100A is sucked in via the suction hole 130s (step S3 of FIG. 1). The suction of the air via the suction hole 130s may be started after the suction surface 120a is brought into contact with the uppermost surface MF of the second region R2 or may be started before the suction surface 120a is brought into contact with the uppermost surface MF of the second region R2.

As seen from FIG. 5, herein, the suction hole 130s is not closed with the upper surface 200a of the semiconductor element 200 so that there is a space between the suction hole 130s and the first region R1. However, the distance along the normal of the lower surface 200b between the first region R1 and the uppermost surface MF of the second region R2 is only about 1.5 µm. Therefore, even when the entirety of the suction hole 130s is not closed with the upper surface 200a of the semiconductor element 200, the semiconductor element 200 can be picked up by the suction of the air via the suction hole 130s.

In the example described with reference to FIG. 6, the periphery of the suction hole 130s is present above the center of the semiconductor element 200A. In FIG. 6, solid circle Cr indicates the position of the center of the semiconductor element 200A. When the periphery of the suction hole 130s is at a position near the center of the semiconductor element 200 as illustrated in FIG. 6, it is possible to pick up the semiconductor element 200 in a more balanced manner, and the semiconductor element 200 is advantageously prevented from falling off the suction surface 120a. When the center of the semiconductor element 200 is in the first region R1, the suction hole 130s may be configured such that the entirety of the suction hole 130s faces the first region R1 as illustrated in FIG. 7 and the periphery of the suction hole 130s is present above the center of the semiconductor element 200.

Figure 8:
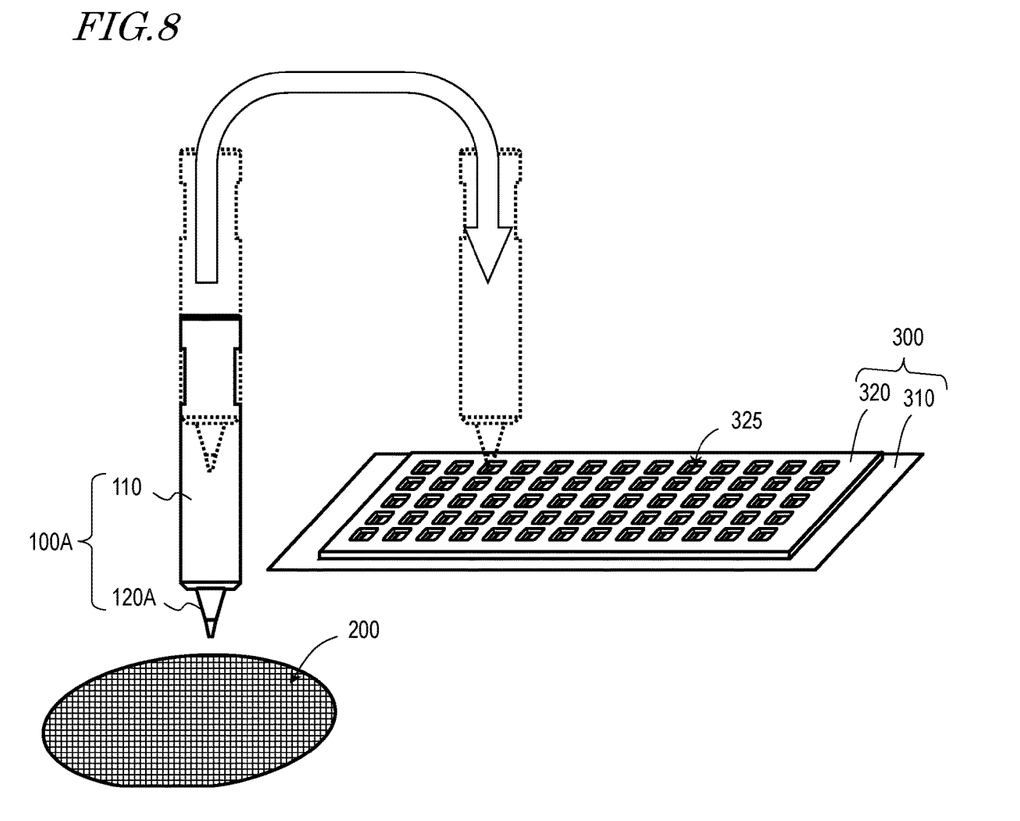
FIG. 8 schematically shows transfer and placement of a semiconductor element 200 from the first position to a support 300 at the second position.

After the semiconductor element 200 is picked up using the collet 100A, the semiconductor element 200 is transferred to the second position that is different from the first position as schematically illustrated in FIG. 8. Herein, a support 300 to which a joining material is applied on its surface is provided, and the support 300 is placed at the second position. As previously described, herein, a composite substrate is illustrated as the support 300. In the configuration illustrated in FIG. 8, the support 300 includes an electrically-conductive leadframe 310 and a resin part 320 which has a plurality of recessed portions 325. The composite substrate as the support 300 can have a repeating structure of units, each including a recessed portion 325, as illustrated in FIG. 8.

Figure 9:
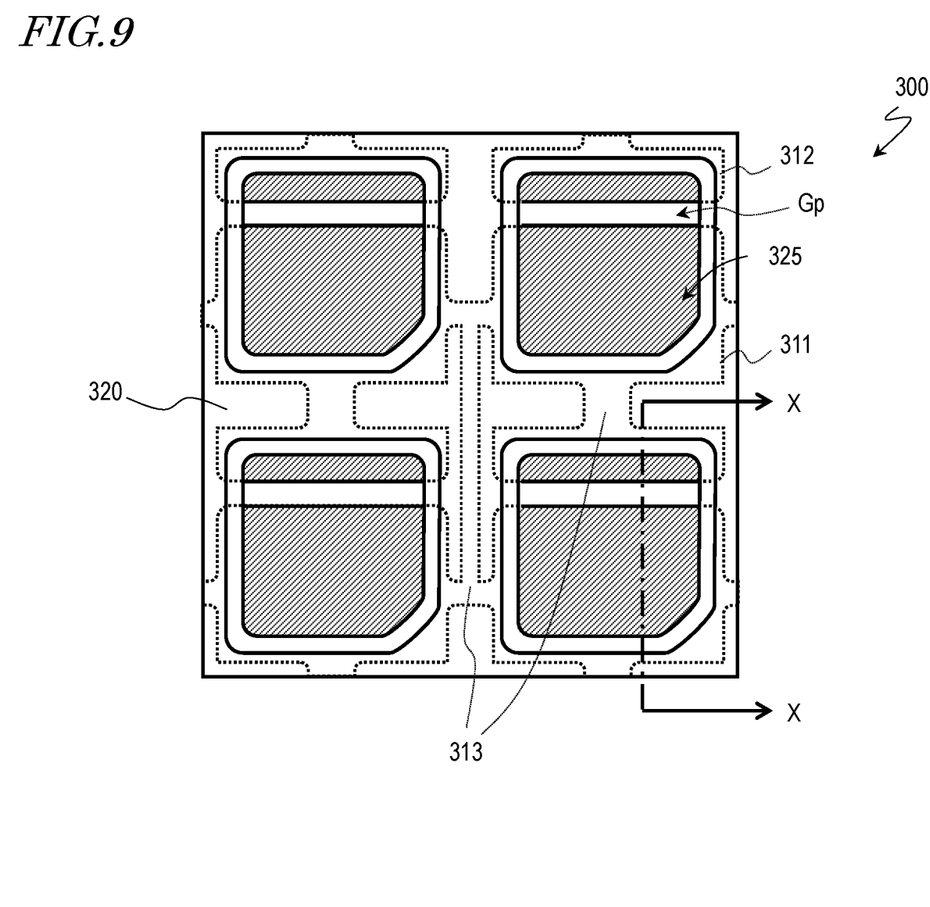
FIG. 9 is a schematic top view enlargedly showing a part of the support 300 shown in FIG. 8.

FIG. 9 shows an exemplary structure of the support 300. In FIG. 9, four of the plurality of units, each including a recessed portion 325, are shown.

The leadframe 310 of the support 300 includes a plurality of pairs of leads, each pair consisting of a first lead 311 which is the first electrically-conductive member and a second lead 312 which is the second electrically-conductive member, and a plurality of connecting portions 313 each interposed between adjoining lead pairs and connecting the adjoining lead pairs with each other. Each of the first lead 311 and the second lead 312 can include a base which is made of, for example, Cu and a metal layer which covers the base. The metal layer which covers the base is, for example, a plating layer including Ag, Al, Ni, Pd, Rh, Au, Cu, or an alloy thereof.

As shown in FIG. 9, a part of the first lead 311 and a part of the second lead 312 are exposed at the bottom of each of the recessed portions 325 of the resin part 320. In FIG. 9, hatched regions represent the parts of the first lead 311 and the second lead 312 exposed at the bottom of the recessed portions 325. Each of the pairs of the first lead 311 and the second lead 312 opposing each other in the recessed portion 325 has a gap Gp formed by spatially separating the first lead 311 and the second lead 312 from each other. The gap Gp is filled with the material that forms the resin part 320.

The resin part 320 is, for example, a light-reflecting member which is made of a resin material including a light-reflecting filler dispersed therein. An example of the light-reflecting filler is metal particles or particles of an inorganic or organic material which has a higher refractive index than a resin used as the basic constituent.

Figure 10:
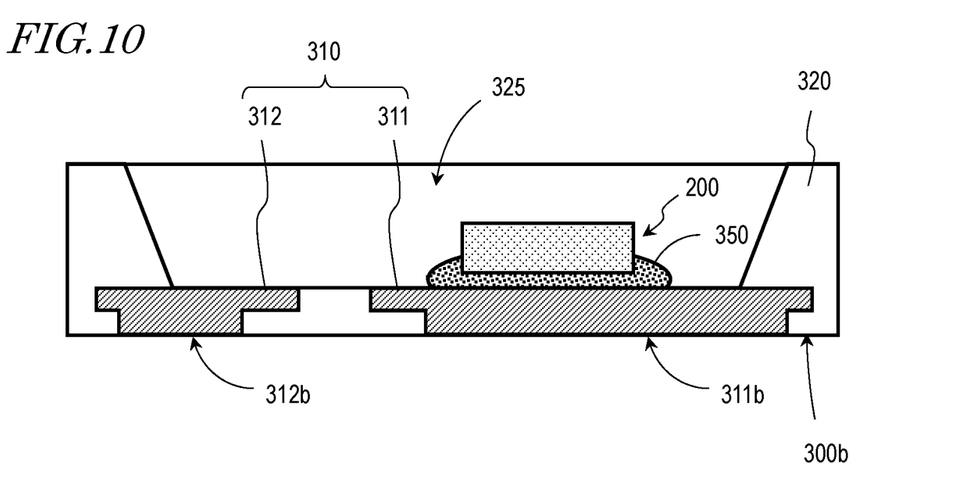
FIG. 10 is a cross-sectional view schematically showing that a semiconductor element 200 is placed on a joining material 350 applied to a leadframe 310.

Herein, a semiconductor element 200 picked up using the collet 100A is transferred and placed in the above-described recessed portion 325. FIG. 10 schematically shows a cross section where the semiconductor element 200 is placed on a joining material 350 applied to the leadframe 310. The joining material 350 used can be an insulative material such as a resin material, e.g., epoxy resin, silicone resin, or the like, or an electrically-conductive material such as an Ag paste. The cross section shown in FIG. 10 is identical with a cross section taken along line X-X of FIG. 9. After the semiconductor element 200 is picked up using the collet 100A, the semiconductor element 200 is moved to a position above the recessed portion 325, and the collet 100A is lowered such that the semiconductor element 200 is placed on the joining material 350. Thereafter, the suction of the air via the suction hole 130s is stopped. This process is repeated, whereby the semiconductor elements 200 are placed in the respective recessed portions 325.

As seen from FIG. 9 and FIG. 10, in this example, at the bottom of each recessed portion 325, the area of a part of the first lead 311 exposed from the resin part 320 is greater than the area of a part of the second lead 312 exposed from the resin part 320. Therefore, herein, the joining material 350 is placed on the first lead 311. By curing the joining material 350, the semiconductor element 200 is fixed to the first lead 311.

Figure 11:
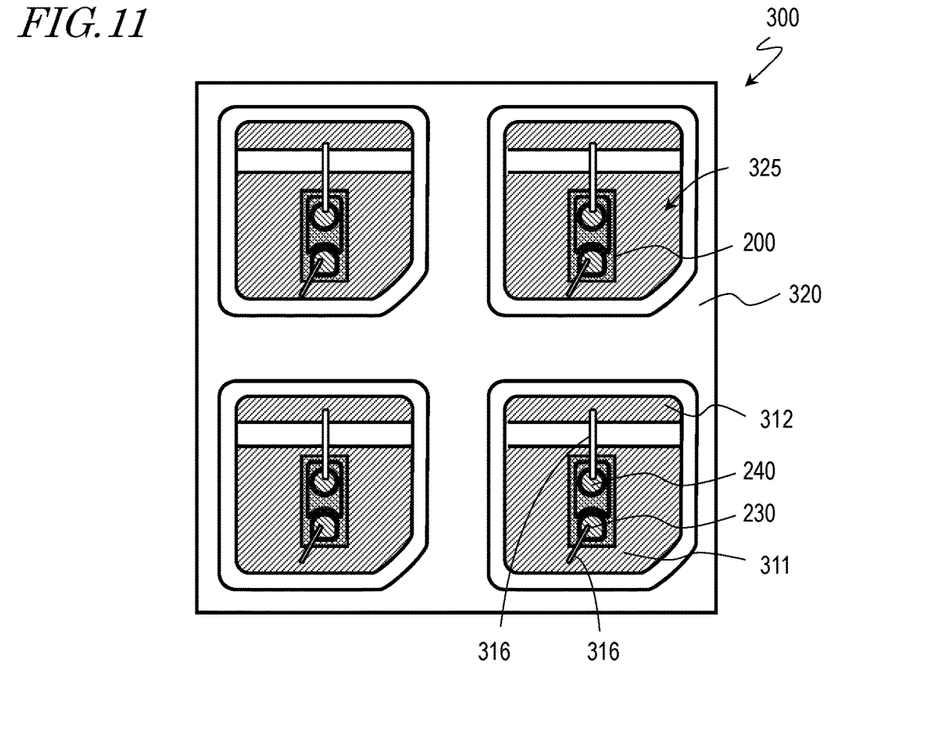
FIG. 11 is a schematic top view showing that the semiconductor element 200 is electrically connected with the first lead 311 and the second lead 312 via electrically-conductive wires 316.

After the semiconductor element 200 is placed in the recessed portion 325, the first electrode 230 and the second electrode 240 of the semiconductor element 200 are electrically connected with the first lead 311 and the second lead 312 as shown in FIG. 11. In FIG. 11, the first electrode 230 is connected with the first lead 311 and the second electrode 240 is connected with the second lead 312 using an electrically-conductive wire 316 of Au, Al, Cu, or the like. Alternatively, the first electrode 230 may be connected with the second lead 312 and the second electrode 240 may be connected with the first lead 311 according to the design. As shown in FIG. 10, the lower surface 311b of the first lead 311 and the lower surface 312b of the second lead 312 are exposed from the resin part 320 at the lower surface 300b side of the support 300. Therefore, a pair of the first lead 311 and the second lead 312 can function as a pair of the positive electrode and the negative electrode. Finally, a light-emitting device which is suitable for mounting by means of flip-chip connection is obtained.

Figure 12:
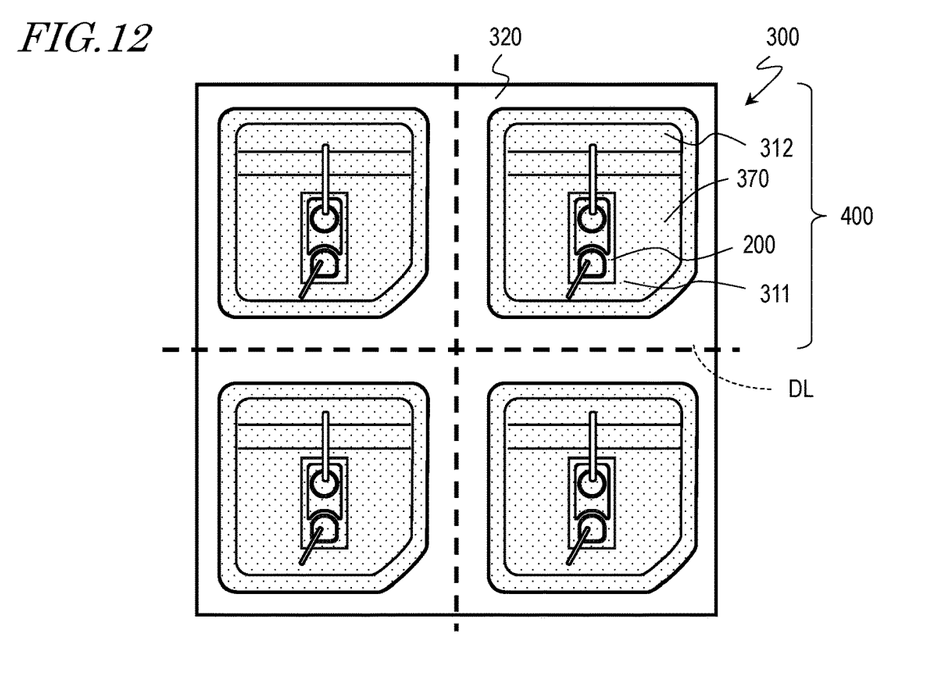
FIG. 12 is a schematic top view showing that an encapsulating part 370 is provided in each recessed portion 325.

Thereafter, as shown in FIG. 12, the respective recessed portions 325 are filled with a resin material, and the resin material is cured, whereby a light-transmitting encapsulating part 370 is formed so as to cover the semiconductor element 200. The resin material used for formation of the encapsulating part 370 can be, for example, a silicone resin. The material used for the encapsulating part 370 may be a material including a resin used as the basic constituent and a wavelength converting material, such as phosphor particles, dispersed in the resin. Light-scattering particles of titanium oxide, silicon oxide, zirconium oxide, aluminum oxide, or the like, may be dispersed in the resin used as the basic constituent.

After the encapsulating part 370 is formed, the structure in which the encapsulating part 370 is formed is cut by a dicing machine or the like. In this step, the resin part 320 and the connecting portion of the leadframe 310 is cut at a position between two adjoining semiconductor elements 200 as represented by a broken line DL in FIG. 12. Through the above-described process, a plurality of light-emitting devices 400 each including a semiconductor element 200 can be obtained.

As described above, according to the embodiment of the present disclosure, in picking up a semiconductor element 200, a region of the suction surface 120a of the collet exclusive of the suction hole 130s is present immediately above the uppermost surface MF of the second region R2. Therefore, occurrence of damage to the semiconductor element 200 due to contact of the collet can be precluded. Particularly when, in picking up a semiconductor element 200, a region of the suction surface 120a of the collet exclusive of the suction hole 130s is present immediately above the second electrode 240, damage to the second electrode 240 which is attributed to such a situation that the suction hole 130s partially overlaps the second electrode 240 can be prevented.

[Variations]

Figure 13:
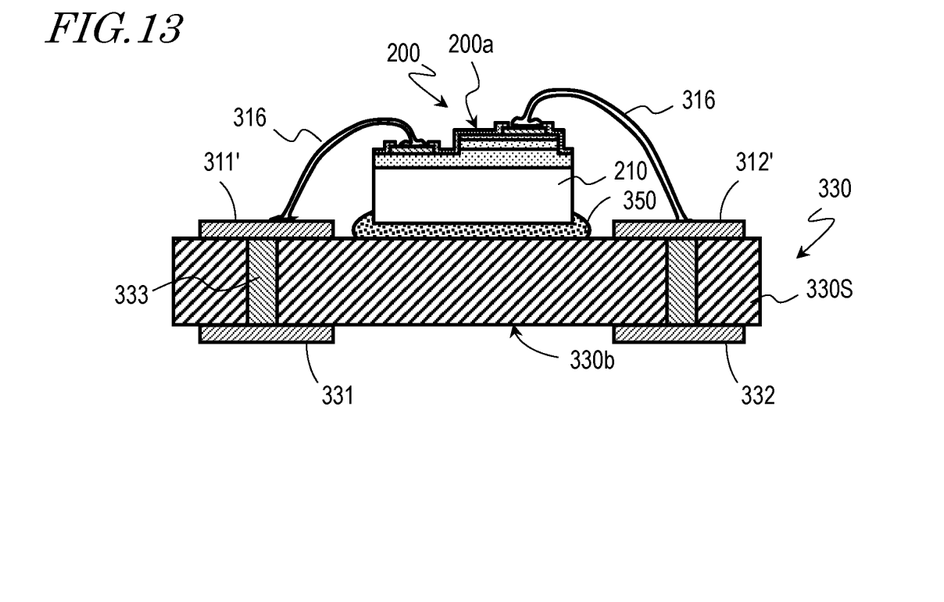
FIG. 13 is a schematic cross-sectional view showing another example of the support 300.

The embodiment of the present disclosure is not limited to the above-described examples, and various variations thereof are possible. For example, a composite substrate which has a protection element, such as a Zener diode, in each unit may be used as the support 300. Alternatively, as shown in FIG. 13, a composite substrate 330 which includes the first wire 311' (first electrically-conductive member) and the second wire 312' (second electrically-conductive member) on the surface of a ceramic substrate 330S may be used as the support 300. In this example, the first wire 311' and the second wire 312' are respectively electrically connected with electrodes 331 and 332 provided on the lower surface 330b side of the ceramic substrate 330S through vias 333 provided in the ceramic substrate 330S. Since the example illustrated in FIG. 8 to FIG. 13 is an example of application to die bonding, a structure which has electrically-conductive leads or wires is used as the support 300. However, when the embodiment of the present disclosure is applied to selection of the semiconductor elements 200, a resin sheet which has an adhesive layer over the surface, or the like, can be provided as the support at the second position.

In the above-described example, the shape of the second electrode 240 as viewed from the top is circular. However, the shape of the second electrode 240 as viewed from the top is not limited to circular but can be arbitrary. The shape, number and arrangement of the suction holes 130s provided in the suction surface 120a are not limited to the above-described example. The suction holes 130s can be appropriately designed according to the shape of the upper surface of an object which is to be picked up.

Figure 14:
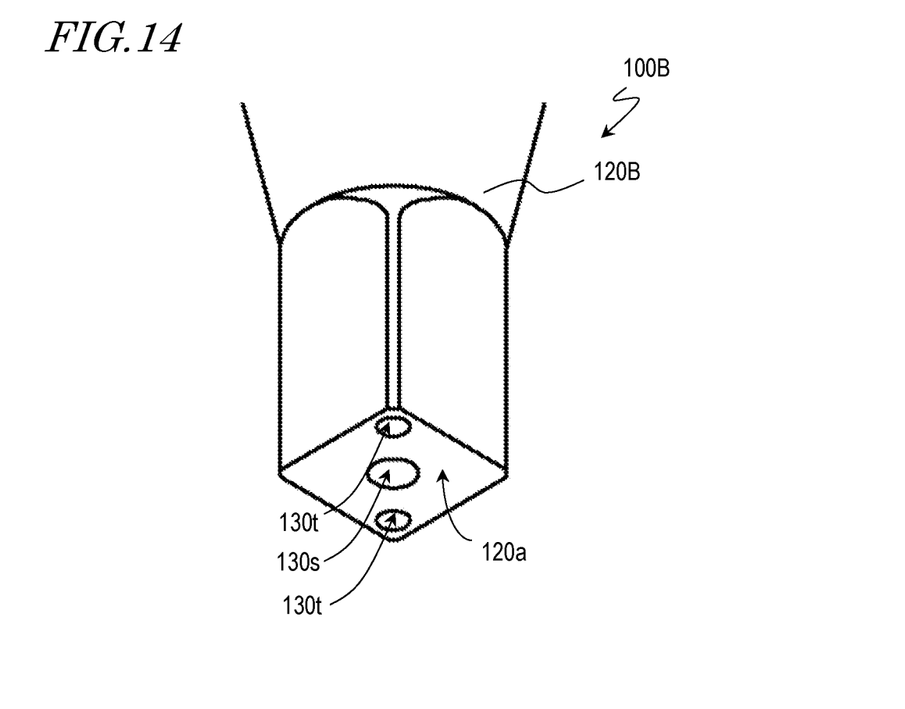
FIG. 14 shows a tip end portion of a variation of the collet.

FIG. 14 shows another example of a collet which is applicable to the embodiment of the present disclosure. The collet 100B shown in FIG. 14 has a tip end portion 120B. In the configuration illustrated in FIG. 14, the suction surface 120a, which is an end surface of the tip end portion 120B, has one suction hole 130s and two suction holes 130t. The suction hole 130s is at the center of the suction surface 120a and is interposed between the two suction holes 130t. Also in this example, the suction surface 120a is a flat surface as in the example previously described with reference to FIG. 3.

Figure 15:
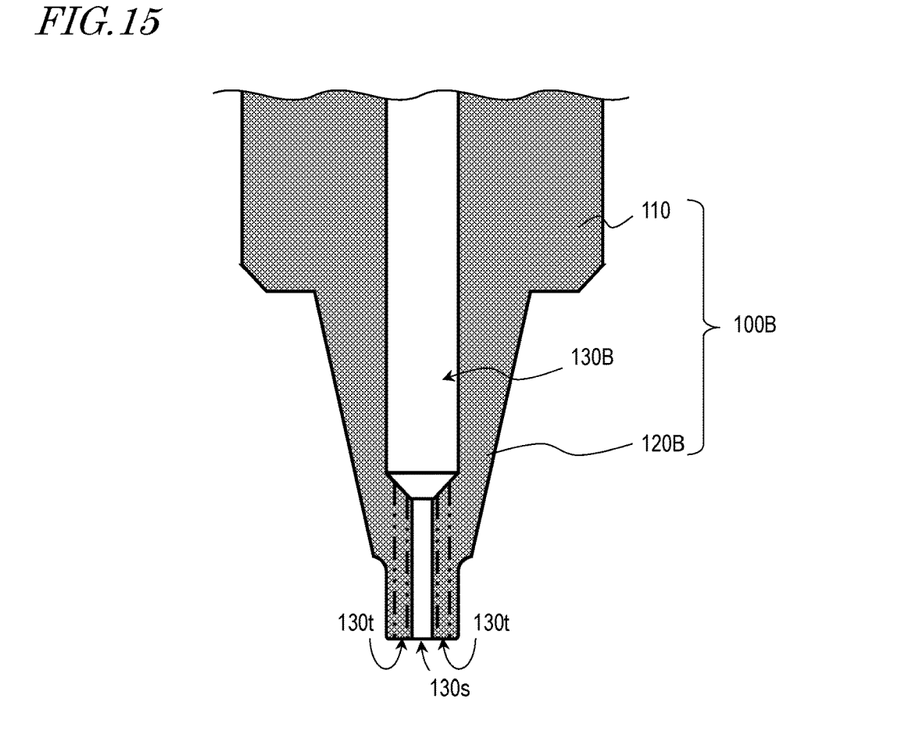
FIG. 15 is a schematic cross-sectional view of the collet 100B shown in FIG. 14.

FIG. 15 schematically shows a cross section of the collet 100B. As schematically shown in FIG. 15, the inside of the collet 100B has a through-hole 130B which has branches. Each of the suction hole 130s and the suction holes 130t at the suction surface 120a is in communication with the through-hole 130B.

Figure 16:
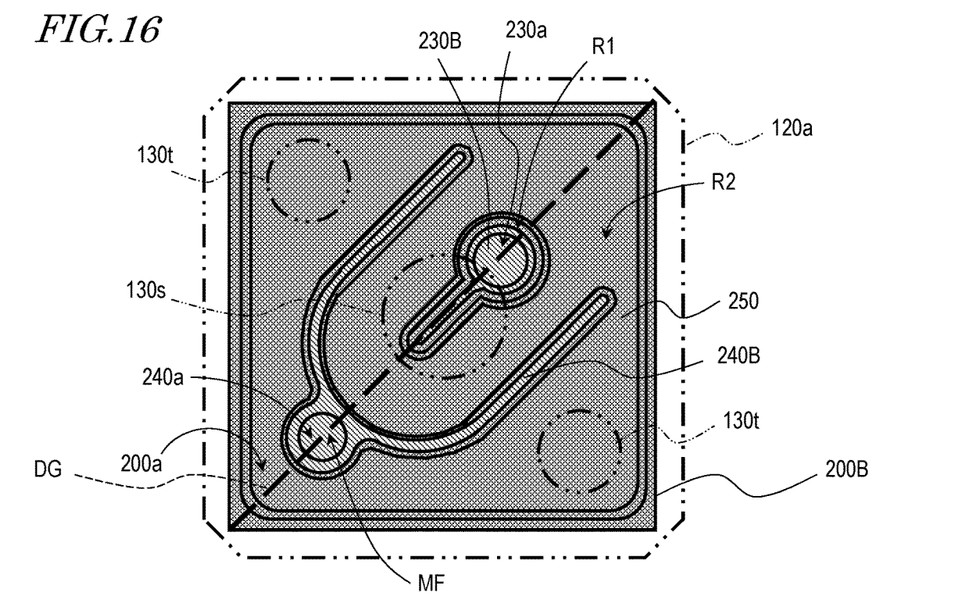
FIG. 16 is a see-through top view showing that the suction surface 120a of the collet 100B is in contact with the uppermost surface MF of the second region R2 of a semiconductor element 200B.

FIG. 16 is a see-through top view showing that the suction surface 120a of the collet 100B is in contact with the uppermost surface MF of the second region R2 of the semiconductor element 200B. The semiconductor element 200B shown in FIG. 16 is another example of the above-described semiconductor element 200. For example, the semiconductor element 200B is a semiconductor light-emitting element.

In the configuration illustrated in FIG. 16, the semiconductor element 200B has a generally square contour. The length of one side of the square is in the range of, for example, not less than 150 µm and not more than 1400 µm. Particularly, the embodiment of the present disclosure can be suitably used in a semiconductor element which includes the first electrode 230B and the second electrode 240B at the positions such as illustrated in FIG. 16 and one side of which has the length of not less than 650 µm and not more than 670 µm. In this example, the second electrode 240B includes a portion which is generally circular as viewed from the top and two linear portions extending from the circular portion. The first electrode 230B is interposed between the two linear portions of the second electrode 240B. As illustrated, each of the first electrode 230B and the second electrode 240B is symmetrical in shape and arrangement with respect to a diagonal of the square which is represented by broken line DG in FIG. 16.

In the semiconductor element 200B, the second region R2 has a shape surrounding the first region R1. Herein, in the upper surface 240a of the second electrode 240B, the surface of the circular portion near the position at which the two linear portions are joined is identical with the uppermost surface MF. Also in this example, picking up of the semiconductor element 200B is carried out such that the uppermost surface MF of the second region R2 comes into contact with a region of the suction surface 120a exclusive of the suction hole 130s as in the example previously described with reference to FIG. 5 and other relevant drawings. Thus, the pressure exerted by the collet 100B can be prevented from concentrating at a part of the uppermost surface MF. Occurrence of damage to the upper surface 200a of the semiconductor element 200B due to contact of the collet 100B can be precluded.

In this example, a part of the suction hole 130s faces the first region R1 while the remaining part of the suction hole 130s overlaps a portion of the second region R2 exclusive of a portion in which the second electrode 240B is provided. In other words, the periphery of the suction hole 130s is not present immediately above the second electrode 240B. Also, the peripheries of the two suction holes 130t are not present immediately above the second electrode 240B. Therefore, occurrence of damage to the upper surface 240a of the second electrode 240B due to contact of the collet 100B can also be precluded.

Now, the arrangement of the suction hole 130s and the suction holes 130t is discussed. These elements are symmetrically arranged with respect to a diagonal represented by broken line DG in FIG. 16 according to the shape and arrangement of the first electrode 230B and the second electrode 240B. The distance between the periphery of the semiconductor element 200B and the periphery of the suction hole 130t and the distance between the periphery of the second electrode 240B and the periphery of the suction hole 130t can be set to, for example, 40 µm or greater. With such a setting of the alignment margin, the periphery of the suction hole 130t can be precluded from being present immediately above the second electrode 240B even when misalignment of about 30 µm occurs.

An embodiment of the present disclosure is advantageous in manufacture of light-emitting devices, such as various light sources for lighting purposes, on-board light sources, light sources for backlights, light sources for displays, etc. The embodiment of the present disclosure is not limited to transfer and placement of a semiconductor light-emitting element but is broadly applicable to transfer and placement of a semiconductor element which has a step in the upper surface. The embodiment of the present disclosure is applicable to transfer and placement of, for example, a protection element such as a Zener diode, a photodetector element, a transistor, etc.

The above disclosed subject matter shall be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure may be determined by the broadest permissible interpretation of the following claims and their equivalents, and shall not be restricted or limited by the foregoing detailed description.

What is claimed is:

1. A method for manufacturing a semiconductor device, comprising:
   (A) orienting an upper surface of a semiconductor element which has the upper surface and a lower surface and a suction surface of a collet which has a suction hole so that the upper surface of the semiconductor device and the suction surface of the collet face each other, the upper surface including a first region and a second region, the second region lying higher than the first region, the first region including a first electrode, the second region including a second electrode;
   (B) bringing the suction surface of the collet into contact with a part of the second region of the semiconductor element; and (C) picking up the semiconductor element using the collet while the collet sucks in air between the first region of the semiconductor element and the suction surface of the collet via the suction hole, wherein in (B), an entirety of an uppermost surface of the second region is in contact with a region of the suction surface exclusive of the suction hole.

2. The method of claim 1, wherein
the semiconductor element includes
- a first semiconductor layer of a first conductivity type, and
- a second semiconductor layer of a second conductivity type provided above a part of the first semiconductor layer, the first electrode is present on a portion of the first semiconductor layer exclusive of a portion above which the second semiconductor layer is provided, and the second electrode is present on the second semiconductor layer.

3. The method of claim 1 wherein, in (B), a part of the suction hole faces the first region, and the remaining part of the suction hole overlaps a portion of the second region exclusive of a portion in which the second electrode is provided.

4. The method of claim 1 wherein, in (B), an entirety of the suction hole faces the first region.

5. The method of claim 1, wherein
the suction hole is a circular opening, and
in (B), a periphery of the suction hole is present above a center of the semiconductor element.

6. The method of claim 1, wherein the suction surface of the collet is a flat surface.

7. The method of claim 1, further comprising:
(D) providing a support to which a joining material is applied on its surface, and
(E) after (C) and (D), placing the semiconductor element on the joining material and stopping the suction of the air via the suction hole.

8. The method of claim 7, wherein
the support includes a first electrically-conductive member and a second electrically-conductive member, and
the method further comprises (F) respectively electrically connecting the first electrode and the second electrode of the semiconductor element with one and the other of the first electrically-conductive member and the second electrically-conductive member of the support.

* * * * *